(12) United States Patent
Wu et al.

(10) Patent No.: US 7,955,959 B2
(45) Date of Patent: Jun. 7, 2011

(54) METHOD FOR MANUFACTURING GAN-BASED FILM LED

(75) Inventors: Jyh Chiarng Wu, Xiamen (CN); Xuejiao Lin, Xiamen (CN); Qunfeng Pan, Xiamen (CN); Meng Hsin Yeh, Xiamen (CN); Huijun Huang, Xiamen (CN)

(73) Assignee: Xiamen Sanan Optoelectronics Technology Co., Ltd., Xiamen (CN)

( * ) Notice: Subject to any disclaimer, the term of this patent is extended or adjusted under 35 U.S.C. 154(b) by 0 days.

(21) Appl. No.: 12/889,101

(22) Filed: Sep. 23, 2010

(65) Prior Publication Data
US 2011/0076791 A1   Mar. 31, 2011

(30) Foreign Application Priority Data
Sep. 25, 2009   (CN) .......................... 2009 1 0019198

(51) Int. Cl.
*H01L 21/205* (2006.01)
*H01L 21/301* (2006.01)
*H01L 21/302* (2006.01)

(52) U.S. Cl. ............... 438/494; 438/28; 438/32; 438/33; 438/492; 438/504; 257/E21.099; 257/E21.112; 257/E21.461; 117/97; 117/104

(58) Field of Classification Search ............ 438/26, 438/28, 32, 33, 492, 493, 494, 504; 257/E21.097, 257/E21.098, E21.099, E21.108, E21.112, E21.131, E21.461; 117/94, 97, 104, 106
See application file for complete search history.

(56) References Cited

U.S. PATENT DOCUMENTS
2010/0283075 A1 * 11/2010 McKenzie et al. .............. 257/98

OTHER PUBLICATIONS

Chang et al., "Improved ESD protection by combining InGaN-GaN MQW LEDs with GaN Schottky diodes," *IEEE Electron Device Letters*, 24:129-131, 2003.

* cited by examiner

*Primary Examiner* — Julio J Maldonado
(74) *Attorney, Agent, or Firm* — Fulbright & Jaworski

(57) ABSTRACT

A method for manufacturing GaN-based film LED based on masklessly transferring photonic crystal structure is disclosed. Two dimensional photonic crystals are formed on a sapphire substrate. Lattice quality of GaN-based epitaxy on the sapphire substrate is improved, and the internal quantum efficiency of GaN-based LED epitaxy is increased. After the GaN-based film is transferred onto heat sink substrate, the two dimensional photonic crystals structure is masklessly transferred onto the light exiting surface of the GaN-based film by using different etching rates between the GaN material and the $SiO_2$ mask, so that light extraction efficiency of the GaN-based LED is improved. That is, the GaN-based film LED according to the invention has a relatively high illumination efficiency and heat sink.

11 Claims, 8 Drawing Sheets

20
METHOD FOR MANUFACTURING GAN-BASED FILM LED

FIELD OF INVENTION

This application claims the benefit of Chinese patent application No. 200910019198.7 titled "A Method for Manufacturing GaN-based Film LED," and filed with the Chinese Patent Office on Sep. 25, 2009.

The present invention relates to a method for manufacturing GaN-based semiconductor light emitting device, and particularly to a method of manufacturing GaN-based film LED based on masklessly transferring photonic crystal structure.

BACKGROUND OF THE INVENTION

With a more and more widespread application of GaN-based light emitting device (LED), a new generation of energy conserving and environment protective solid illumination light source has become a hot pursuit. When promoting the application of LED into common illumination market, there are two greatest technical obstacles, i.e., illumination efficiency and heat sink. On one hand, since a GaN-based semiconductor is a piece of flat plate material with high refractive index coefficient (n=2.5), it can be used as a very efficient waveguide, so that light beam excited in the waveguide will be trapped therein and very little (about 4%) light can escape from the epitaxial surface of GaN-base, i.e. low light extraction efficiency. In order to extract light from LED waveguide, the photonic crystal technology has been developed. That is, if the waveguide has a sub-wavelength through-hole array with appropriate sizes, no light can pass through the waveguide and all the light can only be emitted in a direction perpendicular to the waveguide screen. In the language of photonic crystal, there is a "light band-gap" in the waveguide. On the other hand, presently, most GaN-based epitaxial materials mainly grow on a sapphire substrate. However, due to a poor conductivity of the sapphire, ordinary GaN-based light emitting devices adopt a transverse structure in which two electrodes are located at the same side of the device. Electrical currents flow by different distances transversely in the N-GaN layer and an electrical current block exists, thus generating heat. Moreover, the heat conductivity of sapphire substrate is poor. In order to solve this problem, a Laser Lift-off (LLO) sapphire technology has been developed in recent years. For example, a GaN-based film is deposited on the sapphire substrate through MOCVD technology. Then, the GaN-based film is bonded onto a heat sink material and the sapphire substrate is removed through Laser Lift-off process, to make the device into a vertical structure. Therefore, in consideration of both the two aspects, recent development trend of the technology is to transfer the GaN-based film onto the heat sink substrate; and then photonic crystals are made on a light exiting surface. This technology solves the problem of heat sink, but the improvement of illumination efficiency is still limited. Since there are a relative large lattice dismatch and heat dismatch between the GaN-based semiconductor material and the sapphire substrate, the defect density of the GaN-based epitaxial material is relatively large ($10^8$-$10^{10}$ cm$^{-2}$), such that most of the electrical input is converted into non-radiative combination, i.e., low internal quantum efficiency.

SUMMARY OF THE INVENTION

In order to improve the internal quantum efficiency and light extraction efficiency of GaN-based LED while solving the problem of heat sink, the invention innovatively proposes a method for manufacturing GaN-based film LED based on masklessly transferring photonic crystal structure.

The invention is achieved by a method for manufacturing GaN-based film LED based on masklessly transferring photonic crystal structure, which comprises the followings steps:

1) depositing a SiO2 mask layer onto a sapphire substrate;

2) photoetching and fabricating periodically distributed circular holes on the SiO2 mask layer, exposing the sapphire substrate at the area of circular holes to form two dimensional photonic crystals on the sapphire substrate;

3) growing undoped GaN material layer and GaN-base epitaxy in sequence on the sapphire substrate having the two dimensional photonic crystals using MOCVD process, the GaN-based epitaxy having an N type GaN-based semiconductor layer, an active layer and a P type GaN-based semiconductor layer;

4) depositing a P type Ohmic contact and reflective metal layer on a surface of the P type GaN-based semiconductor layer;

5) depositing welding metal including Au and Au alloy on the P type Ohmic contact and reflective metal layer;

6) bonding the GaN-based epitaxy onto a heat sink substrate by the welding metal;

7) removing the sapphire substrate to expose an interface at which the SiO2 mask layer and the undoped GaN material layer coexist;

8) etching the undoped GaN material layer and SiO2 mask layer of the exposed area simultaneously by dry etching process to expose the N type GaN-based semiconductor layer, and masklessly forming periodically distributed circular holes by using different etching rates between the GaN material and the SiO2 mask to expose the N type GaN-based semiconductor at the area of circular holes, thereby forming two dimensional photonic crystals on the N type GaN-based semiconductor layer, wherein the projecting portions between the circular holes are undoped GaN material layer;

9) depositing a N type Ohmic contact electrode at central area of a surface having the two dimensional photonic crystal structure;

10) depositing a P type electrode at the back face of the heat sink substrate; and 11) forming GaN-based vertical LED chips in a process of slicing or cutting off.

In the invention, the thickness of the SiO2 mask layer is 50 nm~1000 nm; the undoped GaN material layer is firstly filled up into the periodically distributed circular holes area, the thickness of the undoped GaN material layer being 1 μm~6 μm; preferably, the P type Ohmic contact and reflective metal layer is Ag with a thickness of 50 nm~200 nm; the material for preparing the heat sink substrate is selected from a group comprising GaAs, Ge, Si, Cu, Mo, WCu or MoCu; the bonding manner between the GaN-based epitaxy and the heat sink substrate could be bonding linkage or electroplating; the method of removing the sapphire substrate could be laser lift-off, grinding, wet erosion and any combination of two of the aforesaid processes; the undoped GaN material layer and the SiO2 mask layer are simultaneously etched with a ratio of etching rating of 6:1 between the undoped GaN material layer and the SiO2 mask layer; after step 8), a light-aided chemical erosion can be performed on the GaN light exiting surface in order to further improve illumination efficiency.

In the process of the invention, steps 2) and 8) are critical, wherein through step 2), two dimensional photonic crystals are formed on the sapphire substrate, and then GaN-based LED epitaxy proceeds to grow. Based on the principle of transverse epitaxial growing, the dislocation density of growing GaN-based LED epitaxy on the sapphire substrate can be reduced, lattice quality of GaN-based LED epitaxy can be improved, and the internal quantum efficiency of GaN-based LED can be increased; moreover, in step 8), by using a different etching rates (6:1) between the GaN material and the SiO2 mask, two dimensional photonic crystals are masklessly formed on the light exiting surface using a plasma dry etching process in which chlorine gas is used as the main etching gas, i.e., the original two dimensional photonic crystal structure is masklessly transferred onto the light exiting surface of the film GaN-based LED so as to improve light extraction efficiency of the GaN-based LED; at the same time, an epitaxial contact surface is prepared for subsequent process of preparing the N type Ohmic contact electrode, which is one of the inventive points of the invention. Furthermore, at this moment, the film GaN base epitaxy has already been transferred onto the heat sink substrate so that the problem of heat dissipating is solve; therefore, the GaN-based film LED manufactured by the method according to the invention has an enormous potential applicability.

The invention has the following advantageous effects: through forming the photonic crystal structure, the internal quantum efficiency of GaN-based LED epitaxy is improved, and by masklessly transferring the photonic crystal structure, the light extraction efficiency of GaN-based LED is increased; that is, the GaN-based film LED manufactured by the method according to the invention has a relatively high illumination efficiency and heat sink.

Figure 1A:
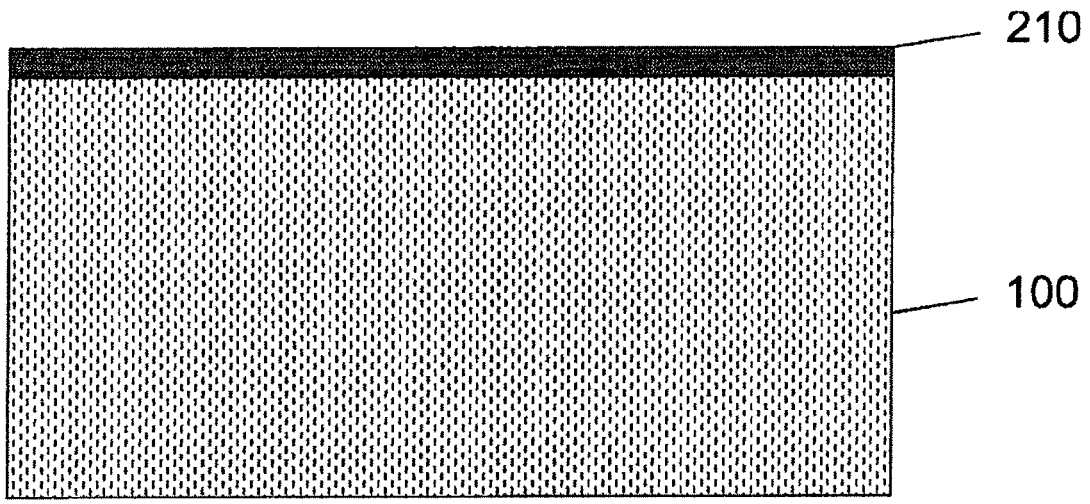
FIGS. 1a-1i are schematic sectional views showing the process of manufacturing GaN-based film LED based on masklessly transferring photonic crystal structure in accordance with a preferred embodiment of the invention.

Explanation on reference numerals in the drawings:
100: the sapphire substrate
210: SiO2 mask layer
220: two dimensional photonic crystals
230: maskless transferring two dimensional photonic crystals
110: undoped GaN material layer
120: N-GaN
130: InGaN/GaN MQW
140: P-GaN
310: P type Ohmic contact and reflective metal film;
320: upper welding metal
330: lower welding metal
340: N type Ohmic contact electrode
350: back electrode
400: heat sink substrate

DESCRIPTION OF THE PREFERRED EMBODIMENTS

The invention will be further described with reference to the drawings and an embodiment of the invention.

Figure 1B:
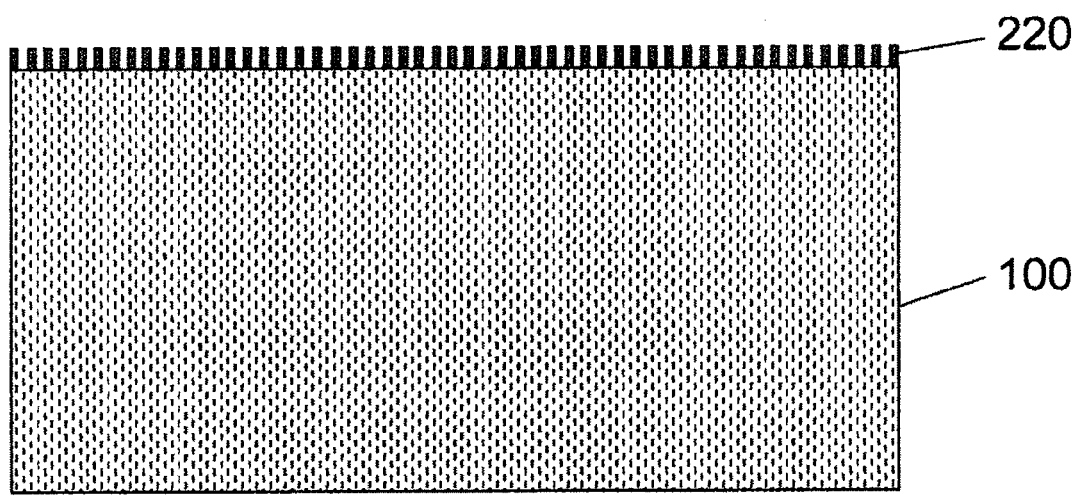
Figure 1C:
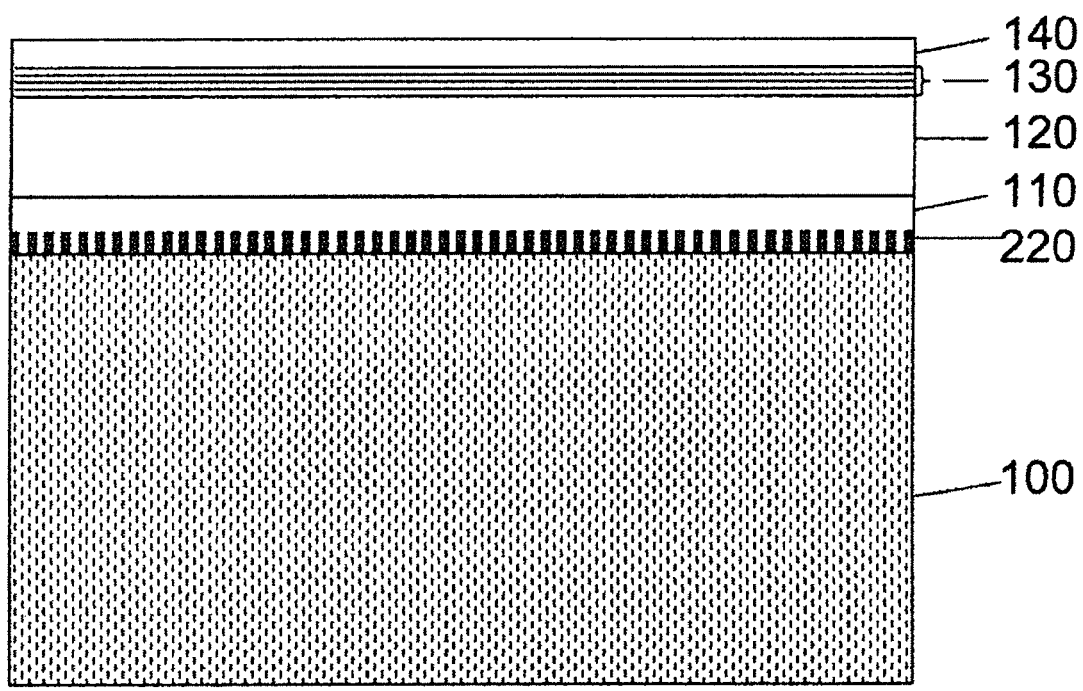
Figure 1D:
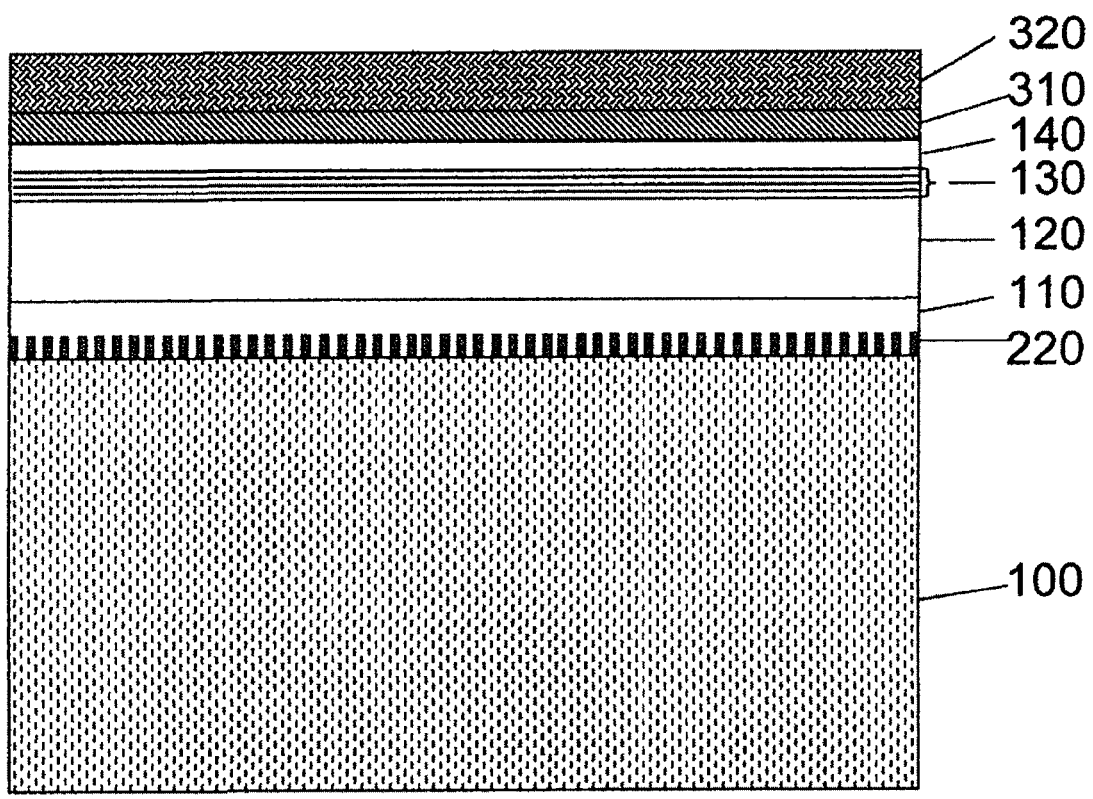
Figure 1E:
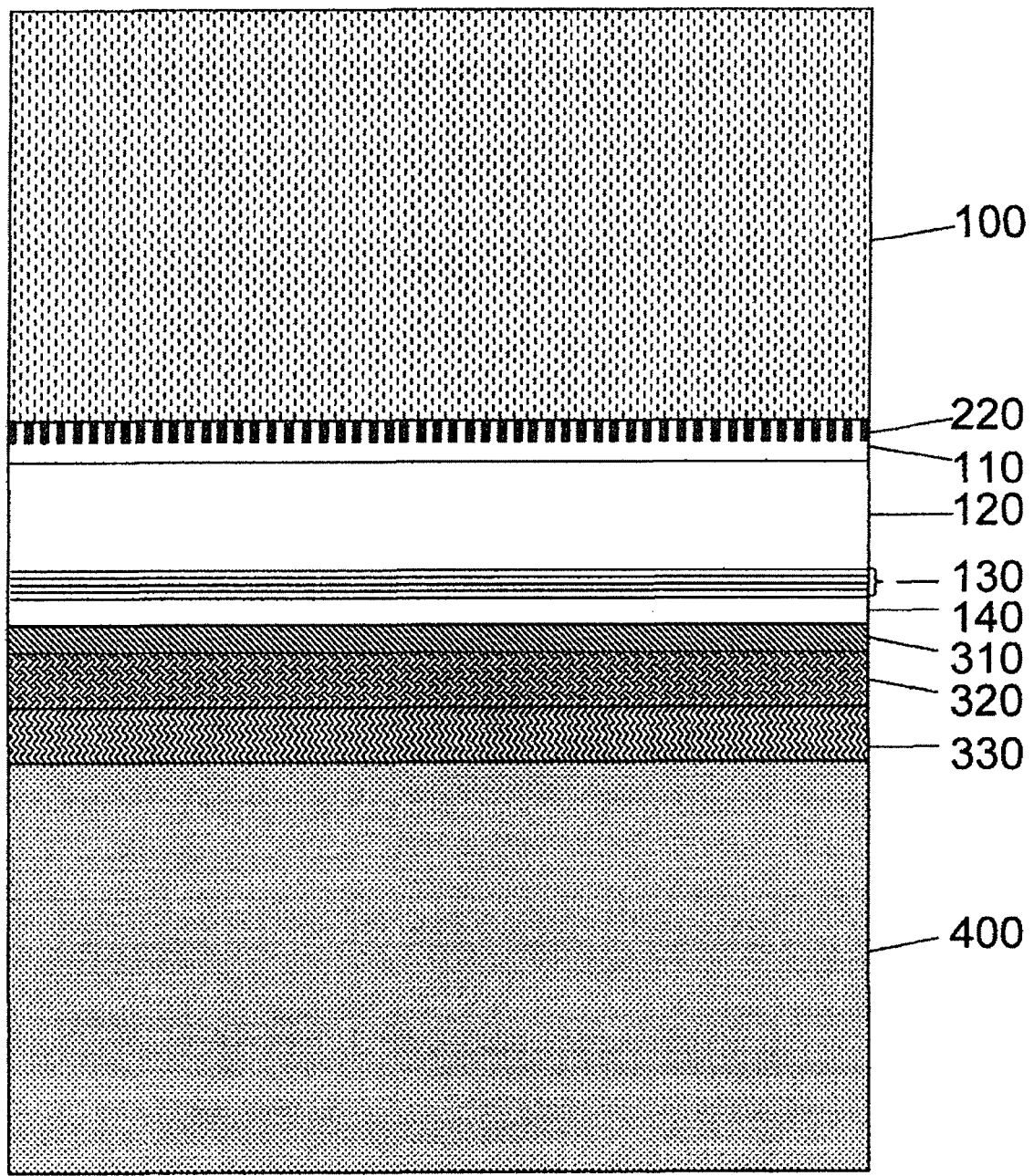
Figure 1F:
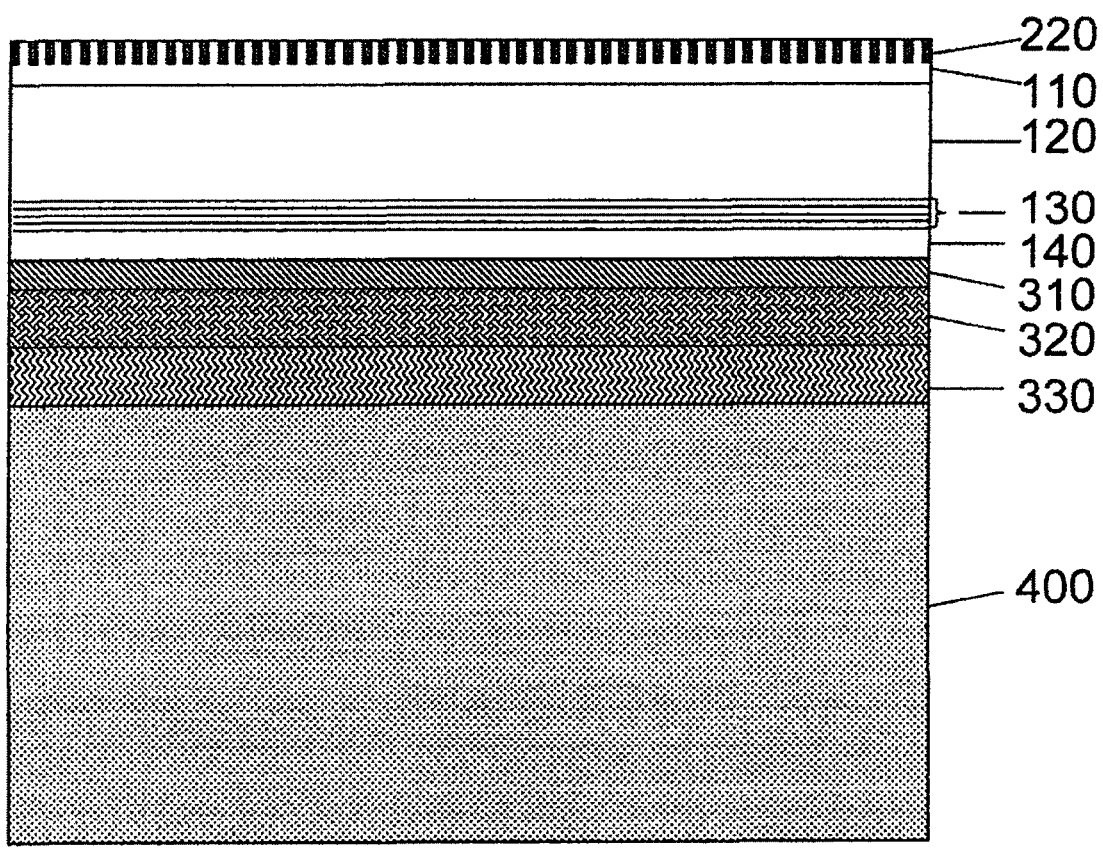
Figure 1G:
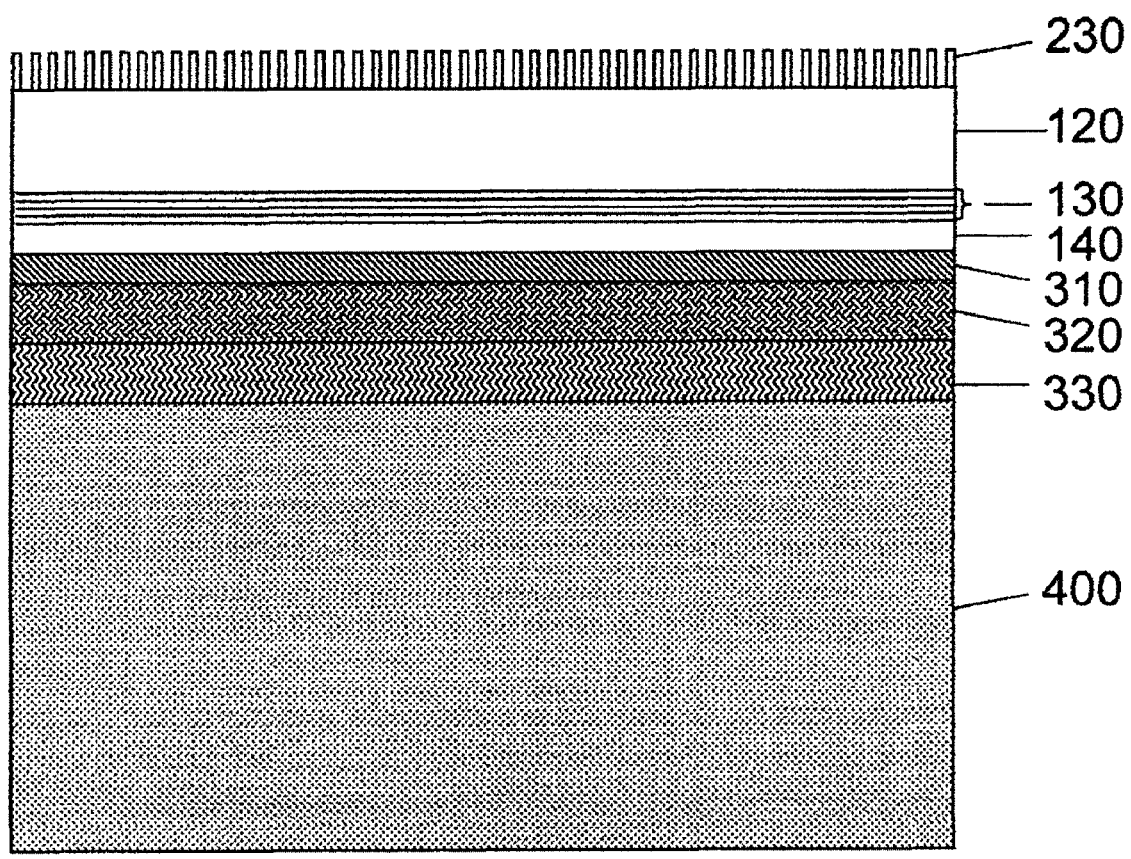
Figure 1H:
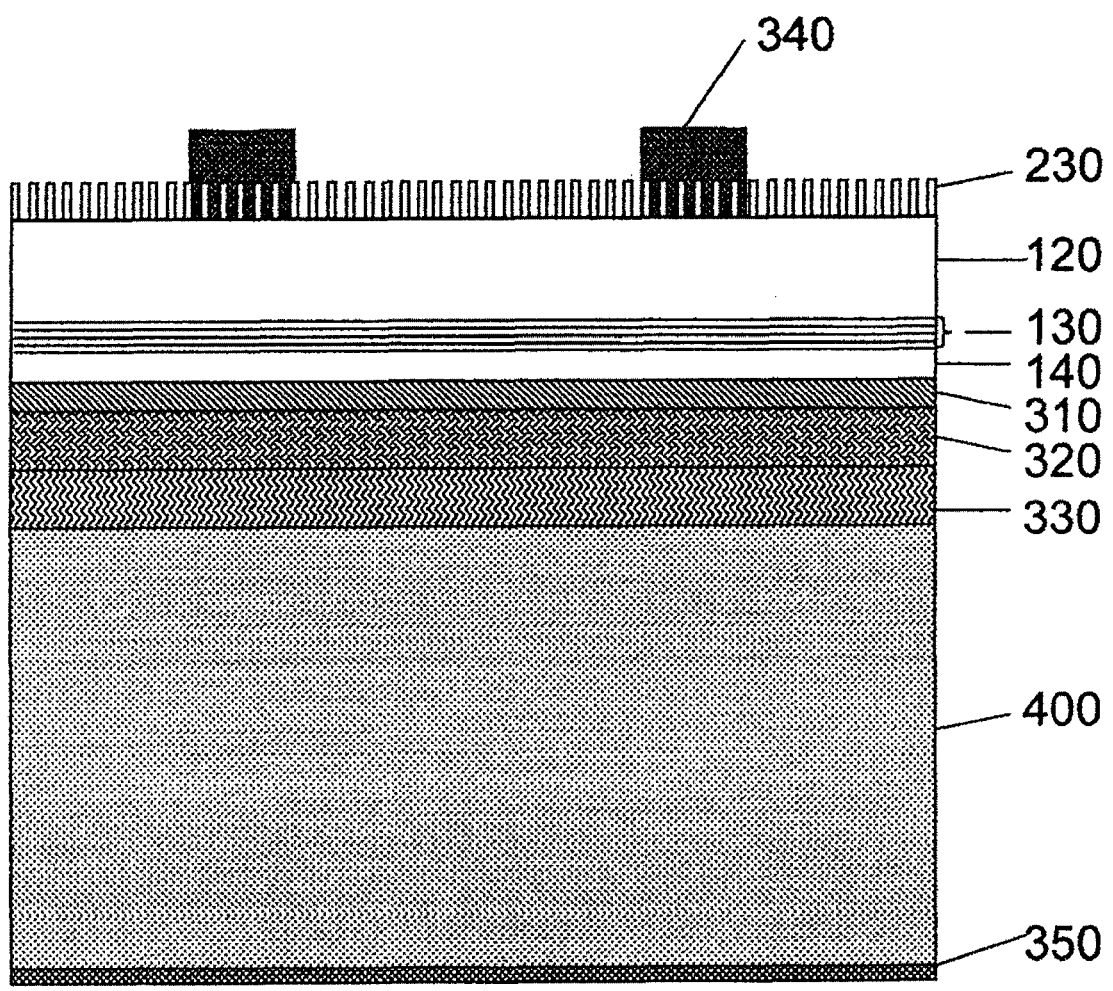
Figure 1I:
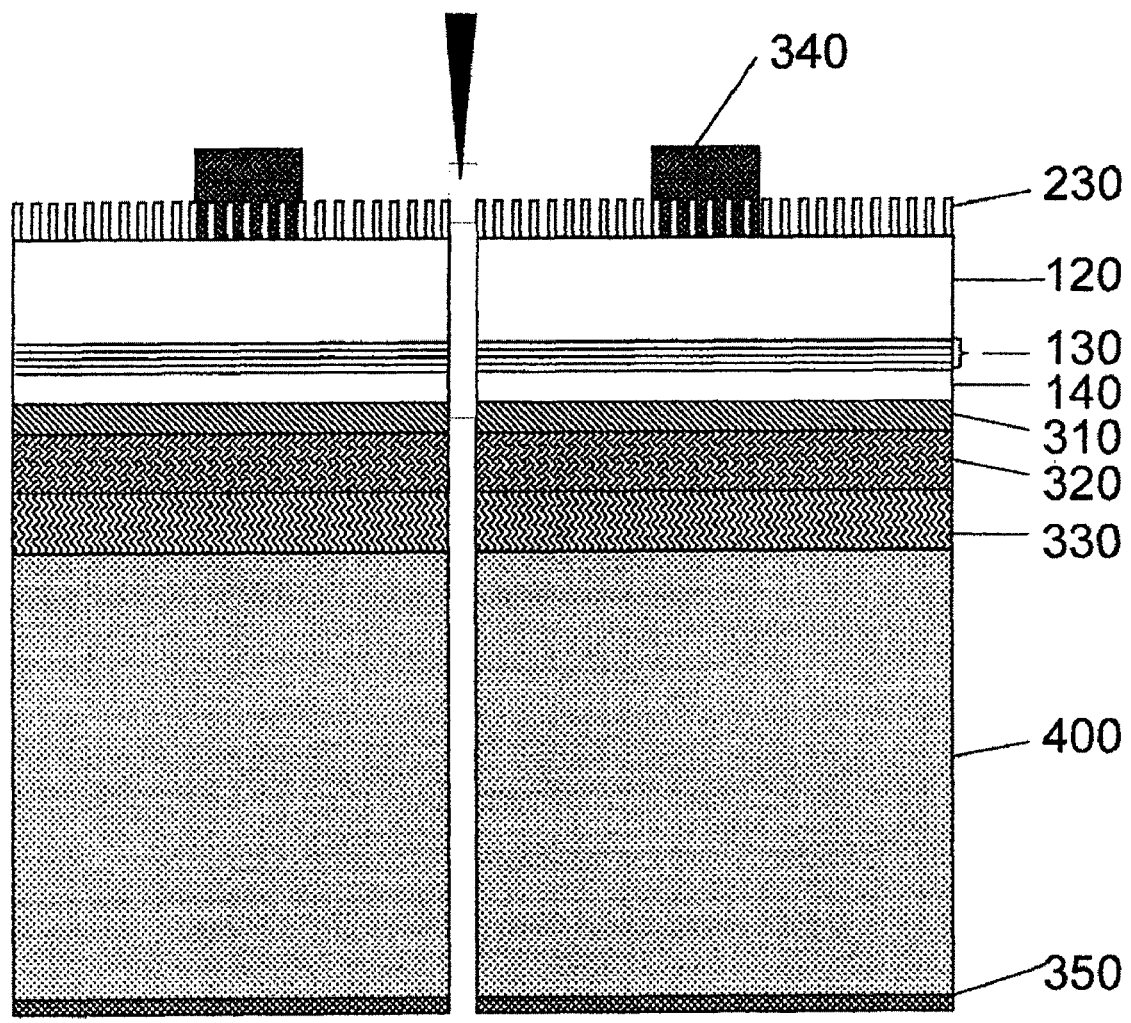

A method for manufacturing GaN-based film LED based on masklessly transferring photonic crystal structure, comprising the following steps:

step 1): depositing a SiO2 mask layer 210 with a thickness of 200 nm onto a sapphire substrate 100 using chemical vapor deposition (CVD), as shown in FIG. 1a;

step 2): photoetching a pattern of two dimensional photonic crystals 220 on the SiO2 mask layer 210 using electron beam exposure technology wherein the period of the photonic crystals is 300 nm and the diameter of the circular holes is 200 nm, and removing the SiO2 mask layer 210 at the area of the circular holes using dry etching to expose the sapphire substrate 100, that is, form two dimensional photonic crystals 220 on the sapphire substrate 100, as shown in FIG. 1b;

step 3): growing undoped GaN material layer 110 and LED epitaxy in sequence on the sapphire substrate 100 having two dimensional photonic crystal structure 200 using a MOCVD process, the LED epitaxy having N-GaN 120, an active layer InGaN/GaN MQW 130 and P-GaN 140; the undoped GaN material layer is firstly filled up into the periodically distributed circular holes area, wherein the thickness of the undoped GaN material layer 110 is 1000 nm, as shown in FIG. 1c;

steps 4) and 5): depositing a P type Ohmic contact and reflective metal film 310 and a upper welding metal 320 in sequence on a surface of the P-GaN 140 through electron beam vaporizing; the P type Ohmic contact and reflective metal film 310 employs Ag with a thickness of 150 nm; the upper welding metal 320 employs Ti/Au with a thickness of 30/1000 nm, as shown in FIG. 1d;

step 6): selecting a Si substrate as a heat sink substrate 400, onto which lower welding metal layer 300 is formed by electron beam vaporizing, the material of the lower welding metal layer 300 is Ti/AuSn with a thickness of 50/1000 nm, wherein the Au to Sn ratio is 80:20; bonding the GaN epitaxy to Si heat sink substrate 400 through eutectic bonding at a temperature of 280° C. and a pressure of 5000N, as shown in FIG. 1e;

step 7): removing the sapphire substrate 100 through 248 nm KrF quasi molecular laser lift-off technology, the energy density of the laser being approximately 1000 mJ/cm²; removing Ga particles on the surface by being soaked into a mixture of HCl and H2O (HCl:H2O=1:1) for 10 minutes so as to expose the interface at which the SiO2 mask layer 210 and the undoped GaN material layer 110 coexist, as shown in FIG. 1f;

step 8): etching the undoped GaN material layer 110 and SiO2 mask layer of the exposed area simultaneously using a dry etching process to expose the N-GaN 120, and masklessly forming periodically distributed circular holes (two dimensional photonic crystals) 230 by using different etching rates (6:1) between the GaN material and the SiO2 mask 210, the circular holes area exposing the N-GaN 120, and the projecting portions between the circular holes being undoped GaN material layer 110; light-aided chemical erosion can be performed on the GaN light exiting surface in order to further improve illumination efficiency, as shown in FIG. 1g;

steps 9) and 10): depositing a N type Ohmic contact electrode 340 at the central area of light exiting surface through electron beam vaporizing, the N type Ohmic contact electrode 340 being in slight contact with the N-GaN distributed in circular holes; depositing a back electrode 350 at the back face of the Si heat sink substrate 400 through electron beam vaporizing, both of which employs Cr/Au, as shown in FIG. 1h;

step 11): forming a GaN-based film LED having photonic crystals structure through cutting, whereby the process of the invention is completed, as shown in FIG. 1i.

The invention claimed is:

1. A method for manufacturing GaN-based film LED based on masklessly transferring photonic crystal structure, comprising the followings steps:

depositing a SiO2 mask layer onto a sapphire substrate;

photoetching and fabricating periodically distributed circular holes on the SiO2 mask layer, exposing the sapphire substrate at the area of circular holes to form two dimensional photonic crystals on the sapphire substrate;

growing undoped GaN material layer and GaN-based epitaxy in sequence on the sapphire substrate having said two dimensional photonic crystals using MOCVD process, the GaN-based epitaxy having a N type GaN-based semiconductor layer, an active layer and a P type GaN-based semiconductor layer;

depositing a P type Ohmic contact and reflective metal layer on a surface of the P type GaN-based semiconductor layer;

depositing welding metal including Au and Au alloy on the P type Ohmic contact and reflective metal layer;

bonding the GaN-based epitaxy onto a heat sink substrate by the welding metal;

removing the sapphire substrate to expose the interface at which the SiO2 mask layer and the undoped GaN material layer coexist;

etching the undoped GaN material layer and SiO2 mask layer of the exposed area simultaneously by dry etching process to expose the N type GaN-based semiconductor layer, and masklessly forming periodically distributed circular holes by using different etching rates between the GaN material and the SiO2 mask to expose the N type GaN-based semiconductor at the area of circular holes, thereby forming two dimensional photonic crystals on the N type GaN-based semiconductor layer, wherein the projecting portions between the circular holes are undoped GaN material layer;

depositing a N type Ohmic contact electrode at central area of a surface having the two dimensional photonic crystal structure;

depositing a P type electrode at the back face of the heat sink substrate; and forming GaN vertical LED chips in a process of slicing or cutting off.

2. The method for manufacturing GaN-based film LED based on masklessly transferring photonic crystal structure according to claim 1, wherein the thickness of the SiO2 mask layer is 50 nm~1000 nm.

3. The method for manufacturing GaN-based film LED based on masklessly transferring photonic crystal structure according to claim 1, wherein the undoped GaN material layer is filled up into the area of the periodically distributed circular holes firstly.

4. The method for manufacturing GaN-based film LED based on masklessly transferring photonic crystal structure according to claim 1, wherein the thickness of the undoped GaN material layer is 1 nm~6 μm.

5. The method for manufacturing GaN-based film LED based on masklessly transferring photonic crystal structure according to claim 1, wherein the P type Ohmic contact and reflective metal layer is Ag with a thickness of 50 nm~200 nm.

6. The method for manufacturing GaN-based film LED based on masklessly transferring photonic crystal structure according to claim 1, wherein the material for preparing the heat sink substrate is selected from a group comprising GaAs, Ge, Si, Cu, Mo, WCu or MoCu.

7. The method for manufacturing GaN-based film LED based on masklessly transferring photonic crystal structure according to claim 1, wherein the bonding manner between the GaN-based epitaxy and the heat sink substrate could be bonding linkage or electroplating.

8. The method for manufacturing GaN-based film LED based on masklessly transferring photonic crystal structure according to claim 1, wherein the method of removing the sapphire substrate could be laser lift-off, grinding, wet erosion and any combination of two of the aforesaid processes.

9. The method for manufacturing GaN-based film LED based on masklessly transferring photonic crystal structure according to claim 1, wherein the undoped GaN material layer and the SiO2 mask layer are simultaneously etched with a ratio of etching rates of 6:1 between the undoped GaN material layer and the SiO2 mask layer.

10. The method for manufacturing GaN-based film LED based on masklessly transferring photonic crystal structure according to claim 1, wherein after step 8, a light-aided chemical erosion is performed on the GaN light exiting surface.

11. The method for manufacturing GaN-based film LED based on masklessly transferring photonic crystal structure according to claim 3, wherein the thickness of the undoped GaN material layer is 1 μm~6 μm.

* * * * *

UNITED STATES PATENT AND TRADEMARK OFFICE
CERTIFICATE OF CORRECTION

| | | |
|---|---|---|
| PATENT NO. | : 7,955,959 B2 | |
| APPLICATION NO. | : 12/889101 | |
| DATED | : June 7, 2011 | |
| INVENTOR(S) | : Wu et al. | |

It is certified that error appears in the above-identified patent and that said Letters Patent is hereby corrected as shown below:

In claim 4, column 6, line 4, delete "nm" and insert --µm-- therefor.

Signed and Sealed this
Thirteenth Day of September, 2011

David J. Kappos
*Director of the United States Patent and Trademark Office*